US012772507B2

(12) United States Patent
Tsai et al.

(10) Patent No.: US 12,772,507 B2
(45) Date of Patent: Oct. 20, 2026

(54) GATED BODY TRANSISTORS

(71) Applicant: GlobalFoundries Singapore Pte. Ltd., Singapore (SG)

(72) Inventors: Ming Tsang Tsai, Singapore (SG); Khee Yong Lim, Singapore (SG); Thanh Hoa Phung, Singapore (SG); Zar Lwin Zin, Singapore (SG); Myo Aung Maung, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 522 days.

(21) Appl. No.: 18/209,184

(22) Filed: Jun. 13, 2023

(65) Prior Publication Data

US 2024/0421233 A1 Dec. 19, 2024

(51) Int. Cl.

| | |
|---|---|
| ***H10D 30/83*** | (2025.01) |
| ***H10D 30/01*** | (2025.01) |
| ***H10D 30/66*** | (2025.01) |
| ***H10D 62/13*** | (2025.01) |

(52) U.S. Cl.

CPC ......... *H10D 30/832* (2025.01); *H10D 30/024* (2025.01); *H10D 30/051* (2025.01); *H10D 30/668* (2025.01); *H10D 62/155* (2025.01); *H10D 62/159* (2025.01)

(58) Field of Classification Search

CPC .. H10D 30/832; H10D 30/024; H10D 30/051; H10D 30/668; H10D 62/155; H10D 62/159; H10D 30/6211; H10D 30/0512; H10D 30/83; H10D 62/343; H10D 62/149; H10D 62/117

See application file for complete search history.

(56) References Cited

U.S. PATENT DOCUMENTS

| | | | | |
|---|---|---|---|---|
| 6,642,090 | B1 | 11/2003 | Fried et al. | |
| 8,466,501 | B2 * | 6/2013 | Hershberger | G06F 30/39 257/270 |
| 8,735,990 | B2 * | 5/2014 | Anderson | H10D 30/024 257/E29.264 |
| 9,076,662 | B2 | 7/2015 | El-Kareh et al. | |
| 2005/0073005 | A1 * | 4/2005 | Nowak | H10D 30/024 257/349 |
| 2009/0212330 | A1 * | 8/2009 | Bernard | H10D 30/026 257/256 |
| 2014/0117462 | A1 * | 5/2014 | Cheng | H10D 30/0241 257/E21.546 |

OTHER PUBLICATIONS

Liu et al., "Vertical GaN Fin JFET: A Power Device with Short Circuit Robustness at Avalanche Breakdown Voltage", 2022 IEEE International Reliability Physics Symposium (IRPS), Mar. 27-31, 2022, Abstract 2 pages.

* cited by examiner

*Primary Examiner* — Syed I Gheyas

(74) *Attorney, Agent, or Firm* — Francois Pagette; Andrew M. Calderon; Calderon Safran & Wright P.C.

(57) ABSTRACT

The present disclosure relates to semiconductor structures and, more particularly, to gated body transistors and methods of manufacture. The structure includes: at least one fin structure composed of semiconductor material and including a channel region between a source region and a drain region; and a gated body under the channel region of the at least one fin structure.

18 Claims, 5 Drawing Sheets

GATED BODY TRANSISTORS

BACKGROUND

The present disclosure relates to semiconductor structures and, more particularly, to gated body transistors and methods of manufacture.

A Junction Field Effect Transistor (JFET) is a unipolar current-controlled semiconductor device with three terminals: source, drain, and gate. JFETs are sometimes referred to as depletion-mode devices, as they rely on the principle of a depletion region, which is devoid of majority charge carriers. The depletion region has to be closed to enable current to flow. JFETs can be used as electronically controlled switches or resistors, or to build amplifiers.

Unlike bipolar junction transistors, JFETs are exclusively voltage-controlled in that they do not need a biasing current. For example, electric charge flows through a semiconducting channel between the source and the drain. Illustratively, a JFET is conducting when there is zero voltage between its gate and source terminals. If a potential difference of the proper polarity is applied between its gate and source terminals, the JFET will be more resistive to current flow, i.e., less current would flow in the channel between the source and drain terminals. Thus, by applying a reverse bias voltage to a gate terminal, the channel is pinched so that the electric current is impeded or switched off completely.

SUMMARY

In an aspect of the disclosure, a structure comprises: at least one fin structure composed of semiconductor material and comprising a channel region between a source region and a drain region; and a gated body under the channel region of the at least one fin structure.

In an aspect of the disclosure, a structure comprises: at least one fin structure comprising a channel region of a first type of impurity; a source region and a drain region on opposing ends of the channel region; a gated body comprising semiconductor material with a second impurity type and which extends underneath the channel region; a shallow trench isolation structure above the gated body; and a deep well of the first type of impurity under the gated body.

In an aspect of the disclosure, a method comprises: forming at least one fin structure composed of semiconductor material and comprising a channel region between a source region and a drain region; and forming a gated body under the channel region of the at least one fin structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to gated body transistors and methods of manufacture. More specifically, the gated body transistors are gated body FIN JFETs. Advantageously, the gated body FIN JFETs described herein exhibit improved Ron, BVdss, and Idoff. Moreover, the gated body FIN JFETs exhibit a simpler manufacturing process compared to conventional FIN JFETs.

In more specific embodiments, the gated body transistors comprise a P+implant layer which acts as a bottom gate. Moreover, the P+bottom gate can be wired out by P+epitaxial semiconductor material. Accordingly, by using the gated body, the presently described transistors eliminate the need for conventional features, e.g., poly gate/metal gate and, as such, exhibit simpler manufacturing processes. The gated body transistors further comprise a fin structure including a channel region between a source region and a drain region, where the P+bottom gate is underneath the channel region. In further embodiments, a deep N-well may be underneath the P+bottom gate. An epitaxial semiconductor layer may also be coupled to the P+bottom gate, which is spaced apart from the source region and the drain region.

The gated body transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the gated body transistors of the present disclosure have been adopted from integrated circuit (IC) technology. For example, the structures are built on wafers and are realized in films of material patterned by photolithographic processes on the top of a wafer. In particular, the fabrication of the gated body transistors uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
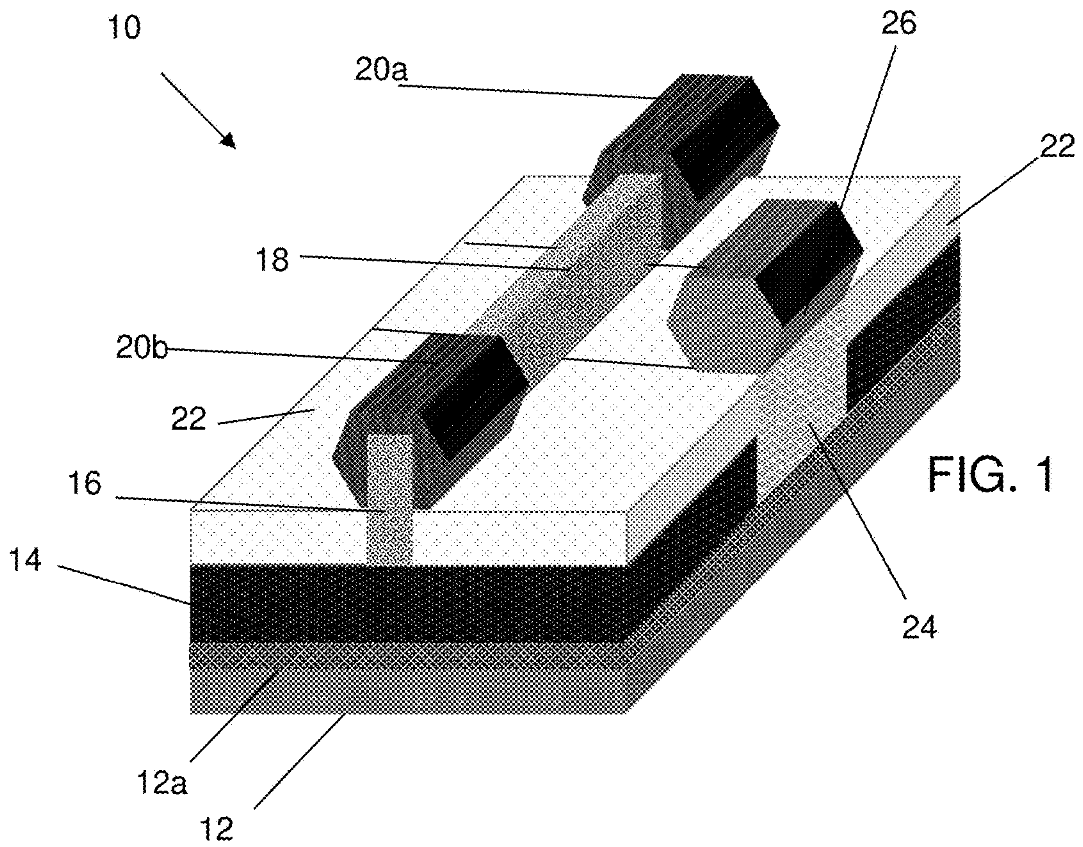
FIG. 1 shows a gated body transistor and respective fabrication processes in accordance with aspects of the present disclosure.

FIG. 1 shows a gated body transistor and respective fabrication processes in accordance with aspects of the present disclosure. More specifically, the structure 10 shown in FIG. 1 is a FIN JFET. The structure 10 includes a semiconductor substrate 12 composed of any suitable material including, but not limited to, Si, SiGe, SiGeC, SiC, GaAs, InAs, InP, and other III/V or II/VI compound semiconductors. The semiconductor substrate 12 may preferably be bulk Si comprising any suitable crystallographic orientation (e.g., a (100), (110), (111), or (001) crystallographic orientation).

In embodiments, the semiconductor substrate 12 may include a deep N-well 12*a*. Moreover, a P-well 14 may be formed in the semiconductor substrate 12, above the deep N-well 12*a*. The deep N-well 12*a* may be used to isolate the device. In embodiments, the deep N-well 12*a* and P-well 14 may be formed by conventional ion implantation processes as described in more detail with respect to FIGS. 5A and 5B.

Still referring to FIG. 1, one or more fin structures 16 may be formed from the semiconductor substrate 12. In embodiments, the fin structure(s) 16 can be formed by a sidewall image transfer (SIT) or a self-aligned double patterning (SADP) as further described with respect to FIG. 5A. In embodiments, the fin structure(s) 16 can be doped with an N+dopant to form a channel region 18 between a source region 20*a* and a drain region 20*b*. For example, the channel region 18 can be formed by conventional ion implantation processes with an N+type dopant, e.g., Arsenic (As), Phosphorus (P) and Antimony (Sb), among other suitable examples. As with any implantation processes, as described herein, an annealing process may be performed to drive in the dopant into the semiconductor substrate 12.

Figure 5A:
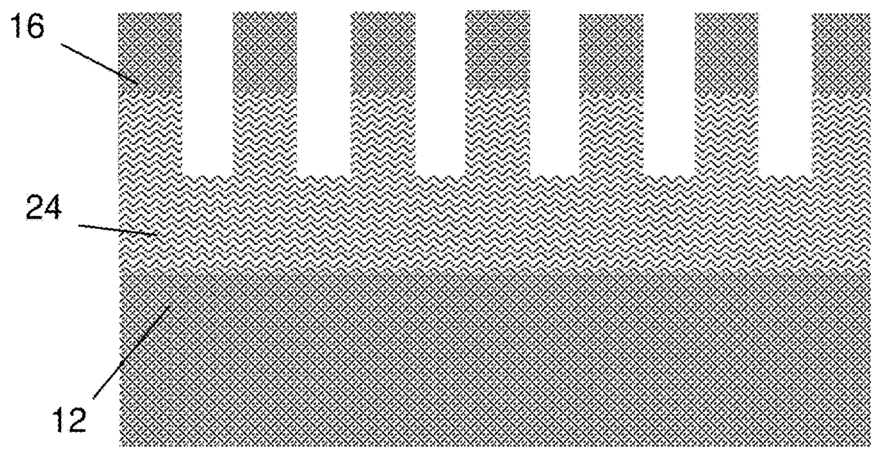
FIGS. 5A-5F show fabrication processes of manufacturing the gated body transistor in accordance with aspects of the present disclosure.
Figure 5B:
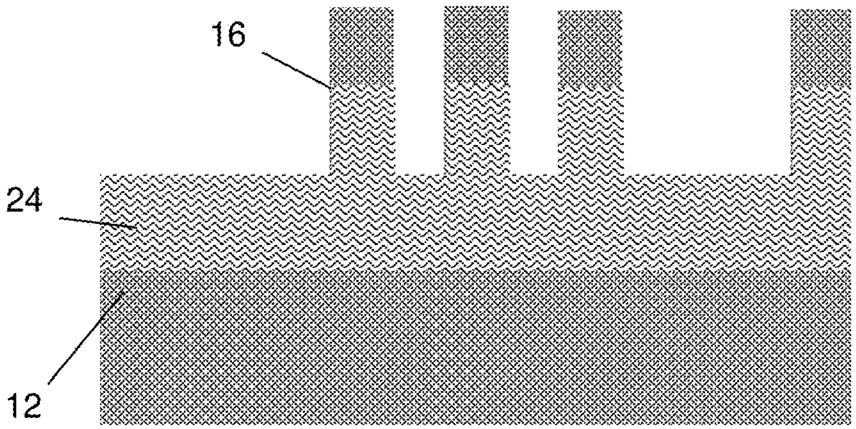
Figure 5C:
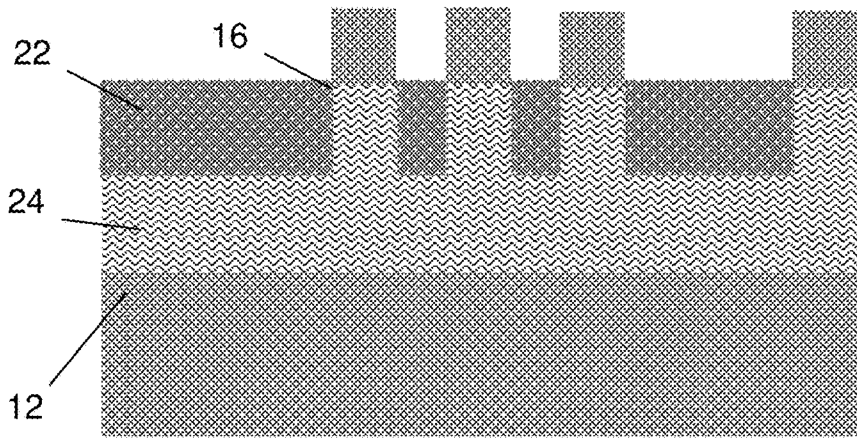
Figure 5D:
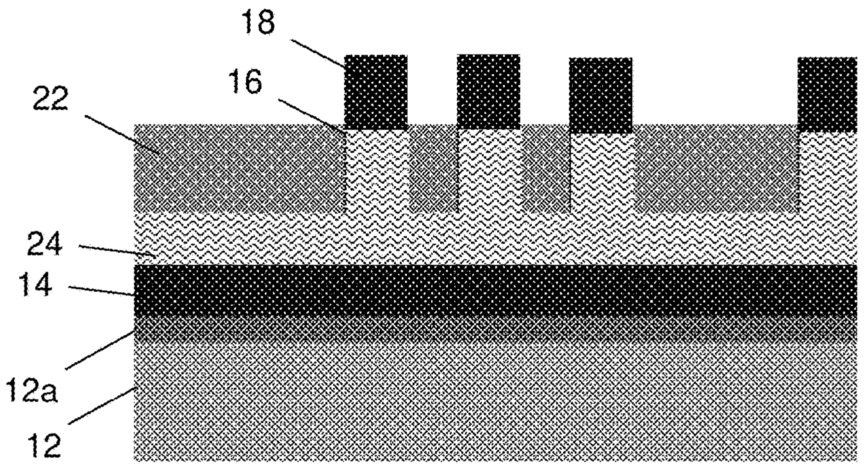
Figure 5E:
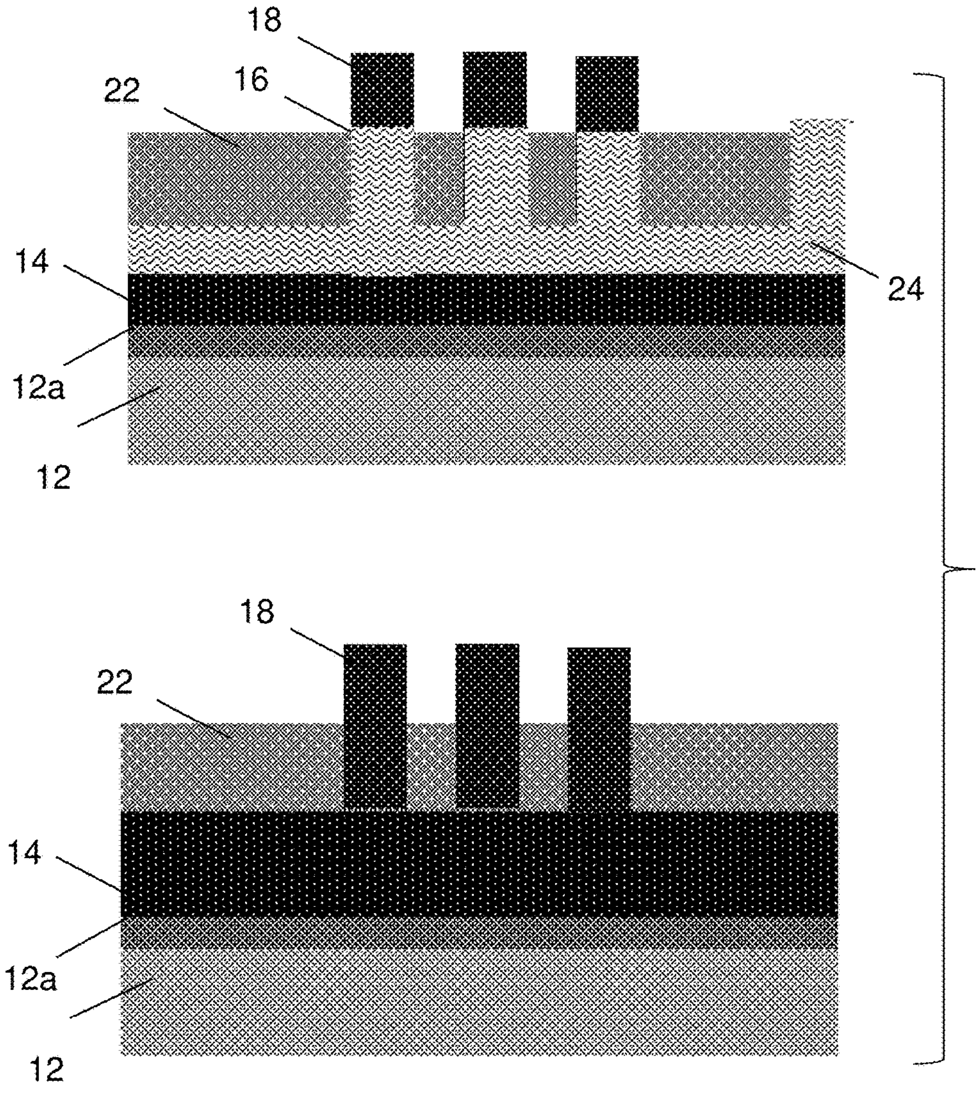
Figure 5F:
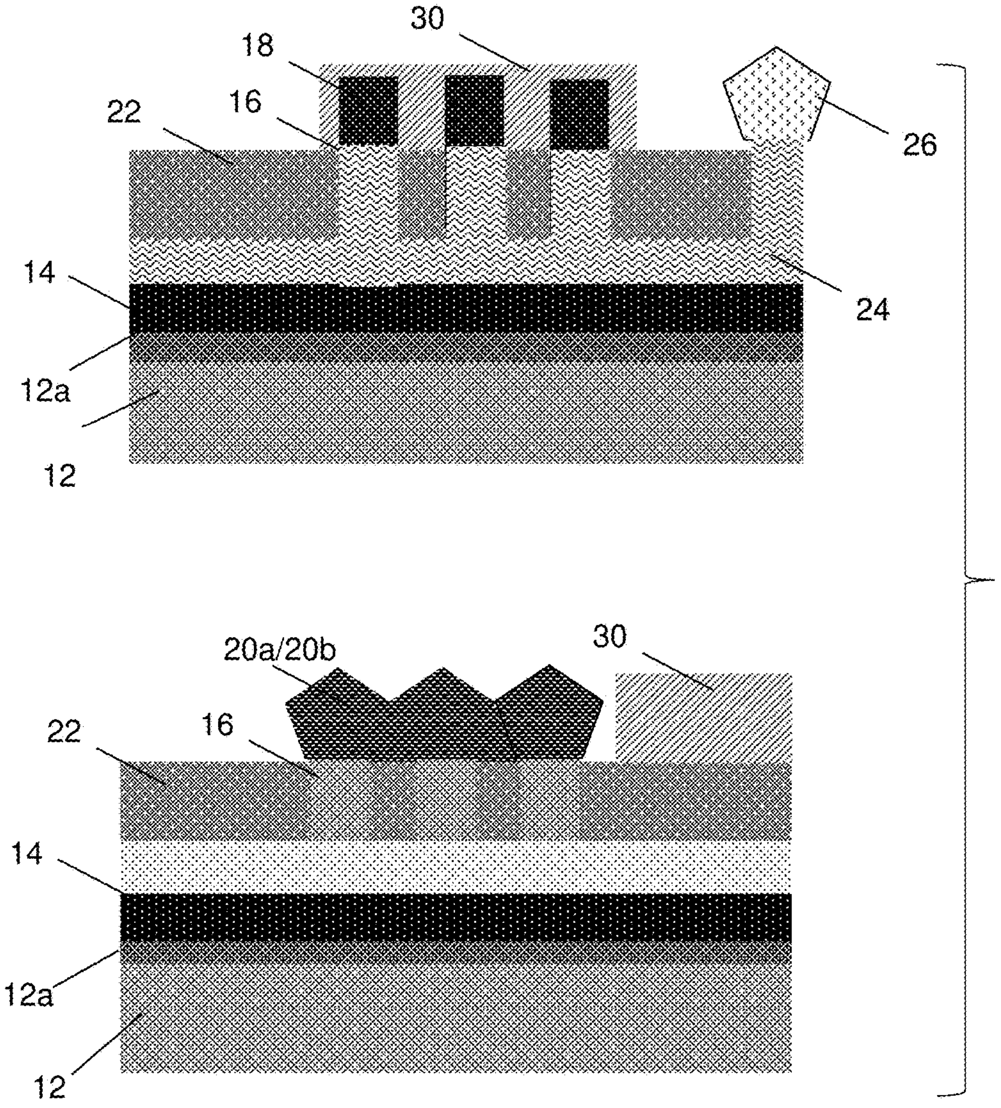

The source region 20*a* and the drain region 20*b* may be raised epitaxial regions formed by epitaxial growth processes as further described in FIG. 5F. In embodiments, for example, the source region 20*a* and the drain region 20*b* may be formed over the fin structure(s) 16 on opposing ends of the channel region 18. The source region 20*a* and the drain region 20*b* may be formed from any semiconductor material and, preferably, Si. The source region 20*a* and the drain region 20*b* may be doped with an n-type impurity as described with respect to FIG. 5F.

Shallow trench isolation structures 22 are adjacent to the fin structure(s) 16. In embodiments, the shallow trench isolation structures 22 are also adjacent, e.g., below a bottom surface, of the source region 20*a* and the drain region 20*b*. In embodiments, the shallow trench isolation structures 22 may be composed of $SiO_2$, as an example. The shallow trench isolation structures 22 may be formed by conventional deposition processes, e.g., CVD.

FIG. 1 further shows a gated body 24 formed underneath the shallow trench isolation structures 22 and which extend to the channel region 18. In embodiments, the gated body 24 is symmetrical. The gated body 24 comprises a P+implant within the P-well 14. In embodiments, the P+implant, e.g., has a higher concentration than the P-well 14. Accordingly, the gated body 24 is a P+gated body composed of semiconductor material, e.g., composed of the same semiconductor material as the semiconductor substrate 12. To improve contact to the gated body 24, an optional epitaxial region 26 may extend to and contact the gated body 24. The optional epitaxial region 26 may also be a p-type epitaxially grown semiconductor material, e.g., p-type doped Si.

Figure 2:
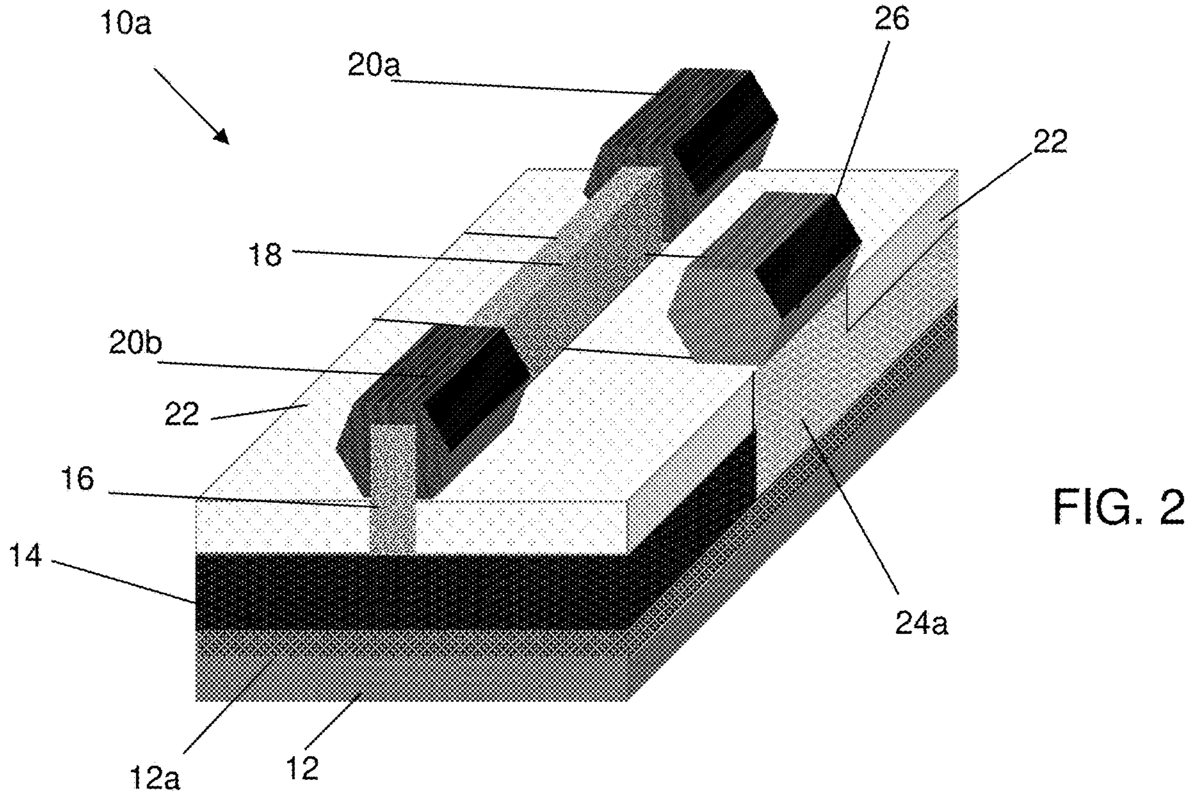
FIG. 2 shows a gated body transistor in accordance with additional aspects of the present disclosure.

FIG. 2 shows a gated body transistor, e.g., FIN JFET, in accordance with additional aspects of the present disclosure. In the structure 10*a* of FIG. 2, the gated body 24*a* is asymmetrical. By way of example, the gated body 24*a* includes a P+body region that may be under the channel region 18 and partly under either the source region 20*a* or drain region 20*b*. In the embodiment shown in FIG. 2, the gated body 24 partly overlaps with and is underneath the source region 20*a*. The remaining features of the structure 10*a* are similar to the structure 10 of FIG. 1 such that no further explanation is required for a complete understanding of the present disclosure.

Figure 3:
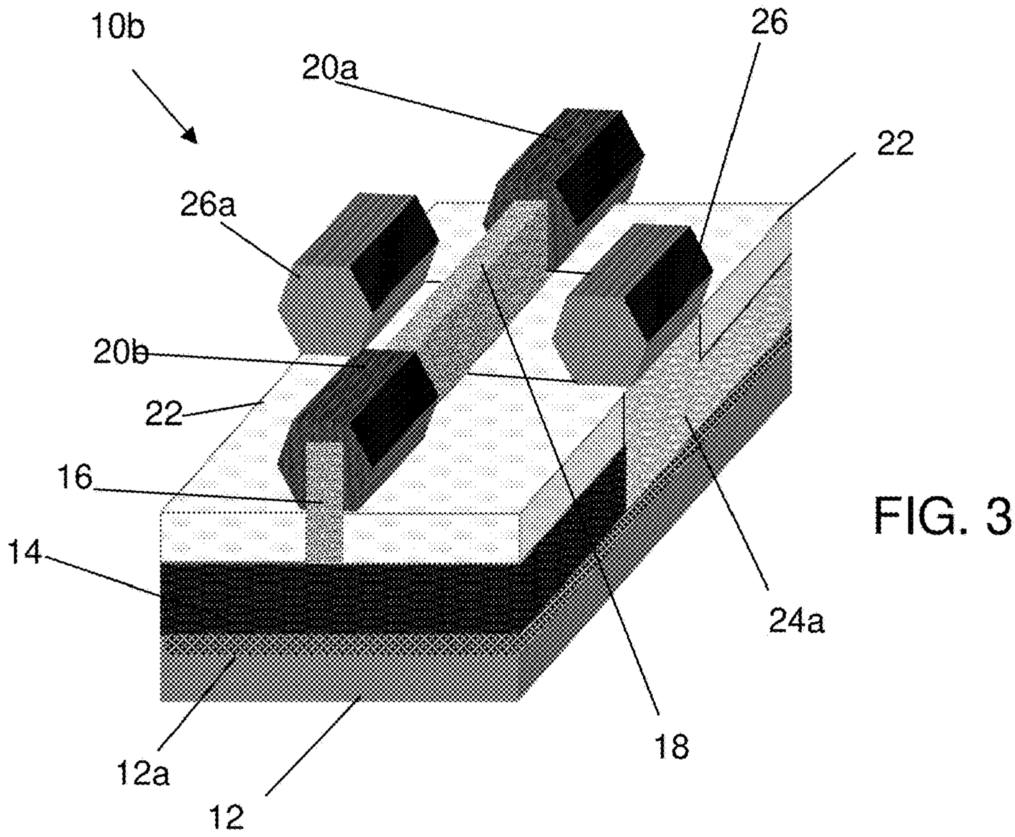
FIG. 3 shows a gated body transistor in accordance with further aspects of the present disclosure.

FIG. 3 shows a gated body transistor, e.g., FIN JFET, in accordance with additional aspects of the present disclosure. In the structure 10*b* of FIG. 3, the gated body 24*a* is also asymmetrical, in addition to having another epitaxial region 26*a* at an opposing side of the channel region 18 from the epitaxial region 26. In embodiments, the epitaxial region 26*a* provides an additional contact to the gated body 24*a*. It should be understood by those of skill in the art that the additional epitaxial region 26*a* may be used with the symmetrical gated body 24 shown in FIG. 1. The remaining features of the structure 10*b* are similar to the structure 10 of FIG. 1 such that no further explanation is required for a complete understanding of the present disclosure.

Figure 4:
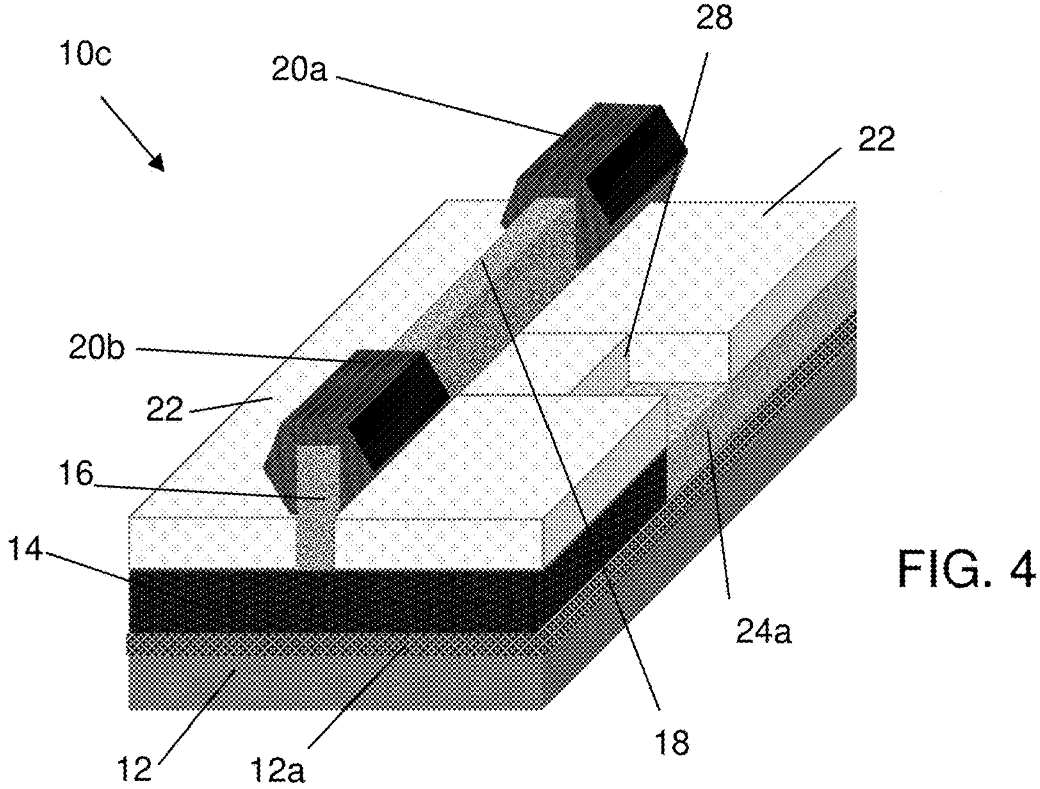
FIG. 4 shows a gated body transistor in accordance with yet additional aspects of the present disclosure.

FIG. 4 shows a gated body transistor, e.g., FIN JFET, in accordance with additional aspects of the present disclosure. In the structure 10*c* of FIG. 4, a process window (e.g., opening) 28 may be provided to the asymmetrical gated body 24*a*. In specific embodiments, the process window 28 is provided within the shallow trench isolation structures 22, which exposes a portion of the asymmetrical gated body 24*a*. A contact may be provided through the process window 28 directly contacting the asymmetrical gated body 24*a*. In this way, it is possible to wire out the asymmetrical gated body 24*a*. It is also contemplated herein that another process window may be provided at the other side of the channel region 18. In addition, it is further contemplated that the process window may be implemented with the symmetrical gated body 24. The remaining features of the structure 10*b* are similar to the structure 10 of FIG. 1 such that no further explanation is required for a complete understanding of the present disclosure.

FIG. 5A-5F show fabrication processes of manufacturing the gated body transistor in accordance with aspects of the present disclosure. In FIG. 5A, for example, the gate body implant (P+implant) is provided in the semiconductor substrate 12. In embodiments, the P+implant may be formed by introducing a dopant by, for example, ion implantation in the semiconductor substrate 12. In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The P+implant may be a p-type dopant, e.g., Boron (B).

FIG. 5A also shows the formation of the fin structures 16. In embodiments, the fin structures 16 may extend into the gate body implant (P+implant). The fin structures 16 may be formed by a SIT technique. In the SIT technique, a mandrel material, e.g., $SiO_2$, is deposited on the semiconductor substrate 12 using conventional chemical vapor deposition (CVD) processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions between the fin structures 16. Spacers are formed on the sidewalls of the mandrels which are preferably material that is different than the mandrels, and which are formed using conventional deposition processes known to those of skill in the art. The spacers can have a width which matches the dimensions of the fin structures 16, for example. The mandrels are removed or stripped using a conventional etching process, selective to the spacers. An etching is then performed within the spacing of the spacers to form the sub-lithographic features. The sidewall spacers can then be stripped. In embodiments, the fin structures 16 can also be formed during this or other patterning processes, or through other conventional patterning processes, as contemplated by the present disclosure.

In FIG. 5B, selected fin structures are removed by conventional lithography and etching processes as is known to those of skill in the art. For example, a resist formed over the fin structures 16 is exposed to energy (light) and developed utilizing a conventional resist developer to form a pattern (opening). An etching process with a selective chemistry, e.g., RIE, will be used to remove the selected fin structures that are exposed through the pattern. The resist may be removed by a conventional oxygen ashing process or other known stripants. In embodiments, the removed fin structures may be dummy fin structures.

In FIG. 5C, the shallow trench isolation structures 22 are formed around the remaining fin structures 16. The shallow trench isolation structures 22 are formed above the body gate implant (P+implant) 24. Also, in embodiments, the shallow trench isolation structures 22 extends partially along a height of the fin structures 16 such that a top of the fin structures 16 remain exposed, e.g., are above the shallow trench isolation structures 22. The shallow trench isolation structures 22 may be formed by a conventional deposition process, e.g., CVD, using an insulator material. in embodiments, the insulator material may be $SiO_2$.

In FIG. 5D, a deep N-well 12*a* may be formed in the semiconductor substrate 12 by conventional ion implantation processes as described herein. For example, the deep N-well 12*a* may be formed using n-type dopants, e.g., e.g., Arsenic (As), Phosphorus (P) and Antimony (Sb), among other suitable examples. In embodiments, the deep N-well 12*a* will isolate the device.

In addition, a P-well 14 may be formed in the semiconductor substrate 12. The P-well 14 may be formed above the deep N-well 12*a* and below the shallow trench isolation structures 22. The P-well 14 may be a p-type dopant such as boron (B). In addition, the channel regions 18 are formed in the fin structures using another n-type implant, e.g., N channel implant.

FIG. 5E shows two views at different locations of the structure, i.e., at the gated body 24 aligned with the channel regions 18 (top representation) and the source/drain regions which are on sides of the gated body 24 and aligned with the source and drain regions (bottom representation). In the top representation, a top part of the fin structure extending above the shallow trench isolation structures 22 that was n-doped and which contacts to the gated body 24 may be removed; whereas the top part of the fin structures of the channel region 18 remain intact. As shown in the bottom representation, a top part of the fin structures extending above the shallow trench isolation structures 22 for the source and drain regions may be removed. It should be understood by those of skill in the art that the selective removal of the fin structures noted in these representations may be performed by a lithography and etching process using a patterned hardmask (resist) 30.

Similar to FIG. 5E, FIG. 5F shows two views at different locations of the structure, i.e., at the gated body 24 aligned with the channel regions 18 (top representation) and the source/drain regions which are on sides of the gated body 24 and aligned with the source and drain regions (bottom representation). In the top representation, epitaxial region 26 may be formed in contact to the gated body 24; whereas, in the bottom representation, the source region 20*a* and the drain region 20*b* may be formed over the remaining fin structures 16.

The epitaxial region 26, source region 20*a* and drain region 20*b* may be formed by in-situ doped epitaxial growth processes with respective masking processes. For example, the epitaxy regions (e.g., source region 20*a* and drain region 20*b*) may be formed in a first growth process with an n-type dopant, while the location for the epitaxial region 26 is protected by a patterned mask. Similarly, the epitaxial region 26 is formed in a second growth process with a p-type dopant, while the location for the source region 20*a* and drain region 20*b* are protected by a patterned mask. In this way, the epitaxial region 26, source region 20*a* and drain region 20*b* are formed by selectively growing a semiconductor material on unprotected or exposed regions of the remaining portions of the respective fin structures 16.

In accordance with exemplary embodiments, the epitaxy regions 20*a*, 20*b*, 26 may include any semiconductor material, e.g., Si or SiGe or other III-V compound semiconductor materials. In embodiments, after the epitaxy step, the source region 20*a* and drain region 20*b* may be further implanted with a p-type or an n-type impurity depending on the region, e.g., the source region 20*a* and drain region 20*b* are doped with an n-type impurity; whereas epitaxial region 26 is doped with a p-type impurity. In accordance with alternative embodiments, the implantation step may be skipped when the epitaxy regions are in-situ doped with the p-type or n-type impurity during the epitaxy growth process.

Although not shown, metallization structures, e.g., wiring structures or interconnect structures, can be formed to the source region 20*a*, drain region 20*b* and epitaxial region 26. For example, subsequent to forming an interlevel dielectric material over the structures, a conventional lithography, etching and deposition method known to those of skill in the art would be performed to form the metallization structures to the source region 20*a*, drain region 20*b* and the gated body 24 (via the epitaxial region 26 or directly through the process window shown in FIG. 4).

Prior to forming the metallization structures, a silicide contact may formed on the source region 20*a*, drain region 20*b* and the gated body 24. As should be understood by those of skill in the art, the silicide process begins with deposition of a thin transition metal layer, e.g., nickel, cobalt or titanium, over fully formed on the source region 20*a*, drain region 20*b* and the gated body 24. After deposition of the material, the structure is heated allowing the transition metal to react with exposed silicon (or other semiconductor material as described herein) in the active regions of the semiconductor device (e.g., on the source region 20*a*, drain region 20*b* and the gated body 24) forming a low-resistance transition metal silicide. Following the reaction, any remaining transition metal is removed by chemical etching, leaving silicide contacts in the active regions of the device.

The gated body transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

at least one fin structure composed of semiconductor material and comprising a channel region between a source region and a drain region; and a gated body under the channel region of the at least one fin structure, wherein the gated body comprises P+ semiconductor material extending to underneath the channel region.

2. The structure of claim 1, further comprising a deep N-well and P-well under the gated body.

3. The structure of claim 1, wherein the gated body is symmetrical.

4. The structure of claim 1, wherein the gated body is asymmetrical.

5. The structure of claim 1, wherein the source region and the drain region comprise epitaxial semiconductor material on the at least one fin structure.

6. A structure comprising:

at least one fin structure composed of semiconductor material and comprising a channel region between a source region and a drain region, wherein the source region and the drain region comprise epitaxial semiconductor material on the at least one fin structure;

a gated body under the channel region of the at least one fin structure, and a shallow trench isolation structure above the gated body and surrounding the at least one fin structure.

7. The structure of claim 6, further comprising an epitaxial semiconductor material above the shallow trench isolation structure and which contacts the gated body.

8. The structure of claim 6, further comprising epitaxial semiconductor material above the shallow trench isolation structure and on both sides of the channel region, each of which contact the gated body.

9. The structure of claim 6, further comprising a process window in the shallow trench isolation structure which opens to the gated body.

10. A structure comprising:

at least one fin structure comprising a channel region of a first type of impurity;

a source region and a drain region on opposing ends of the channel region;

a gated body comprising semiconductor material with a second impurity type and which extends underneath the channel region;

a shallow trench isolation structure above the gated body; and a deep well of the first type of impurity under the gated body.

11. The structure of claim 10, wherein the first type of impurity comprises an n-type impurity and the second type of impurity comprises a p-type impurity.

12. The structure of claim 11, further comprising an epitaxial semiconductor material above the shallow trench isolation structure and contacting the gated body.

13. The structure of claim 12, wherein the epitaxial semiconductor material contacts the gated body on both sides of the channel region.

14. The structure of claim 11, wherein the gated body is symmetrical.

15. The structure of claim 11, wherein the gated body is asymmetrical.

16. The structure of claim 11, wherein the shallow trench isolation structure includes an opening to the gated body.

17. The structure of claim 11, wherein the source region and the drain region are a raised source region and a raised drain region comprising epitaxial semiconductor material on the fin structure at the opposing ends of the channel region.

18. A method comprising:

forming at least one fin structure composed of semiconductor material and comprising a channel region between a source region and a drain region; and forming a gated body under the channel region of the at least one fin structure, wherein the gated body comprises P+ semiconductor material extending to underneath the channel region.

* * * * *